US012234107B2

(12) United States Patent
Lee et al.

(10) Patent No.: US 12,234,107 B2
(45) Date of Patent: Feb. 25, 2025

(54) APPARATUS AND METHOD FOR TRANSFERRING THE SUBSTRATE

(71) Applicant: SEMES CO., LTD., Chungcheongnam-do (KR)

(72) Inventors: Myung Jin Lee, Gyeonggi-do (KR); Sang Oh Kim, Seoul (KR); Hee Jae Byun, Gyeonggi-do (KR); Na Hyun Lee, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 483 days.

(21) Appl. No.: 17/750,223

(22) Filed: May 20, 2022

(65) Prior Publication Data
US 2023/0111772 A1    Apr. 13, 2023

(30) Foreign Application Priority Data
Oct. 12, 2021   (KR) .................. 10-2021-0135268

(51) Int. Cl.
*B65G 47/92*   (2006.01)
*H02K 41/03*   (2006.01)

(52) U.S. Cl.
CPC ........... *B65G 47/92* (2013.01); *H02K 41/031* (2013.01)

(58) Field of Classification Search
CPC ........ H01L 21/67742; H01L 21/67709; B65G 54/02; B65G 47/92; H02K 41/031
USPC ..................................................... 310/12.27
See application file for complete search history.

(56) References Cited

U.S. PATENT DOCUMENTS

| 6,339,266 | B1 * | 1/2002 | Tanaka ................. H02K 41/03 310/91 |
| 6,720,680 | B1 * | 4/2004 | Tanaka ................. G05D 3/12 355/53 |
| 6,835,941 | B1 * | 12/2004 | Tanaka ................. H02K 41/03 318/566 |
| 9,246,377 | B2 * | 1/2016 | Fukasawa ........... H01L 21/6776 |
| 10,684,558 | B2 * | 6/2020 | Duijsens ................. H01L 21/68 |
| 10,725,389 | B2 * | 7/2020 | Aoki ....................... F16C 39/06 |
| 10,759,613 | B2 * | 9/2020 | Neubauer ............ H02K 41/031 |
| 10,819,205 | B2 * | 10/2020 | Lu ............................ H02P 8/00 |

(Continued)

FOREIGN PATENT DOCUMENTS

| KR | 10-1277070 | 6/2013 |
| KR | 10-1288599 | 7/2013 |
| KR | 10-2020-0124315 | 11/2020 |

*Primary Examiner* — Alex W Mok
(74) *Attorney, Agent, or Firm* — WOMBLE BOND DICKINSON (US) LLP

(57) ABSTRACT

A substrate transferring apparatus including a non-contact type driving unit is provided. The substrate transferring apparatus comprises a stator assembly including a driving surface and an electromagnetic generating module, a first mover including a first magnet module facing the electromagnetic generating module and floating and moving on the driving surface, and including a first inclined surface, a second mover including a second magnet module facing the electromagnetic generating module and floating and moving on the driving surface, and including a second inclined surface, and a transfer member disposed between the first mover and the second mover and moving along the first inclined surface and the second inclined surface according to a distance between the first mover and the second mover.

20 Claims, 15 Drawing Sheets

(56) References Cited

U.S. PATENT DOCUMENTS

| | | | | |
|---|---|---|---|---|
| 10,826,369 B2* | 11/2020 | Angood | | G01B 21/047 |
| 10,850,932 B2* | 12/2020 | Feyrer | | H02K 41/031 |
| 10,926,418 B2* | 2/2021 | Lu | | H02K 7/14 |
| 10,958,148 B2* | 3/2021 | Lu | | H02K 41/031 |
| 2011/0100252 A1* | 5/2011 | Fukukawa | | H02K 41/031 |
| | | | | 104/293 |
| 2020/0030995 A1* | 1/2020 | Lu | | H02K 7/14 |

* cited by examiner

APPARATUS AND METHOD FOR TRANSFERRING THE SUBSTRATE

This application claims the benefit of Korean Patent Application No. 10-2021-0135268, filed on Oct. 12, 2021, in the Korean Intellectual Property Office, the disclosure of which is incorporated herein by reference in its entirety.

BACKGROUND

1. Field present invention relates to a substrate transferring apparatus and method.

2. Description of the Related Art

When manufacturing a semiconductor device or a display device, various processes such as photography, etching, ashing, ion implantation, thin film deposition, and cleaning are performed. Here, the photography process includes coating, exposure, and developing processes. A photoresist is applied on a substrate (i.e., a coating process), a circuit pattern is exposed on the substrate, on which a photosensitive film is formed (i.e., an exposure process), and an exposed region of the substrate is selectively developed (i.e., a developing process).

SUMMARY

Meanwhile, in order for the substrate to undergo the various processes described above, the substrate should be moved to equipment performing each process. The transfer robot transfers a substrate from one equipment (e.g., coating equipment) to another equipment (e.g., exposure equipment). However, since the transfer robot includes a contact type driving unit, it cannot be free from particle generation.

An object of the present invention is to provide a substrate transferring apparatus including a non-contact type driving unit.

Another object of the present invention is to provide a substrate transferring method using a substrate transferring apparatus including a non-contact type driving unit.

The objects of the present invention are not limited to the objects mentioned above, and other objects not mentioned will be clearly understood by those skilled in the art from the following description.

According to an aspect of the present disclosure, there is provided an apparatus for transferring a substrate comprising, a stator assembly including a driving surface and an electromagnetic generating module, a first mover including a first magnet module facing the electromagnetic generating module and floating and moving on the driving surface, and including a first inclined surface, a second mover including a second magnet module facing the electromagnetic generating module and floating and moving on the driving surface, and including a second inclined surface, and a transfer member disposed between the first mover and the second mover and moving along the first inclined surface and the second inclined surface according to a distance between the first mover and the second mover.

According to another aspect of the present disclosure, there is provided an apparatus for transferring a substrate comprising, a stator assembly including a driving surface and an electromagnetic generating module, a first mover including a first magnet module facing the electromagnetic generating module and floating and moving on the driving surface, and including a first bottom surface and a first inclined surface forming an acute angle to each other, a second mover including a second magnet module facing the electromagnetic generating module and floating and moving on the driving surface, and including a second bottom surface and a second inclined surface forming an acute angle to each other, wherein the second inclined surface faces the first inclined surface to each other, and a transfer member disposed between the first mover and the second mover and moving along the first inclined surface and the second inclined surface according to a distance between the first mover and the second mover, wherein the transfer member includes a first support surface facing the first inclined surface, and a second support surface facing the second inclined surface, wherein the first mover includes a first magnet member installed in the first inclined surface, and the transfer member includes a second magnet member installed in the first support surface, wherein the second mover includes a third magnet member installed in the second inclined surface, and the transfer member includes a fourth magnet member installed in the second support surface.

According to an aspect of the present disclosure, there is provided a method for transferring a substrate comprising, providing a substrate transferring apparatus including a first mover floating and moving on a driving surface and including a first inclined surface, a second mover floating and moving on the driving surface and including a second inclined surface, and a transfer member disposed between the first mover and the second mover, and moving along the first inclined surface and the second inclined surface, wherein a height of the transfer member is a first height in case of a distance between the first mover and the second mover being a first distance, wherein the first mover and the second mover move away from each other so that a distance between the first mover and the second mover becomes a second distance, and as the first mover and the second mover move, the transfer member are lowered along the first inclined surface and the second inclined surface so that a height of the transfer member becomes a second height.

The details of other embodiments are included in the detailed description and drawings.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
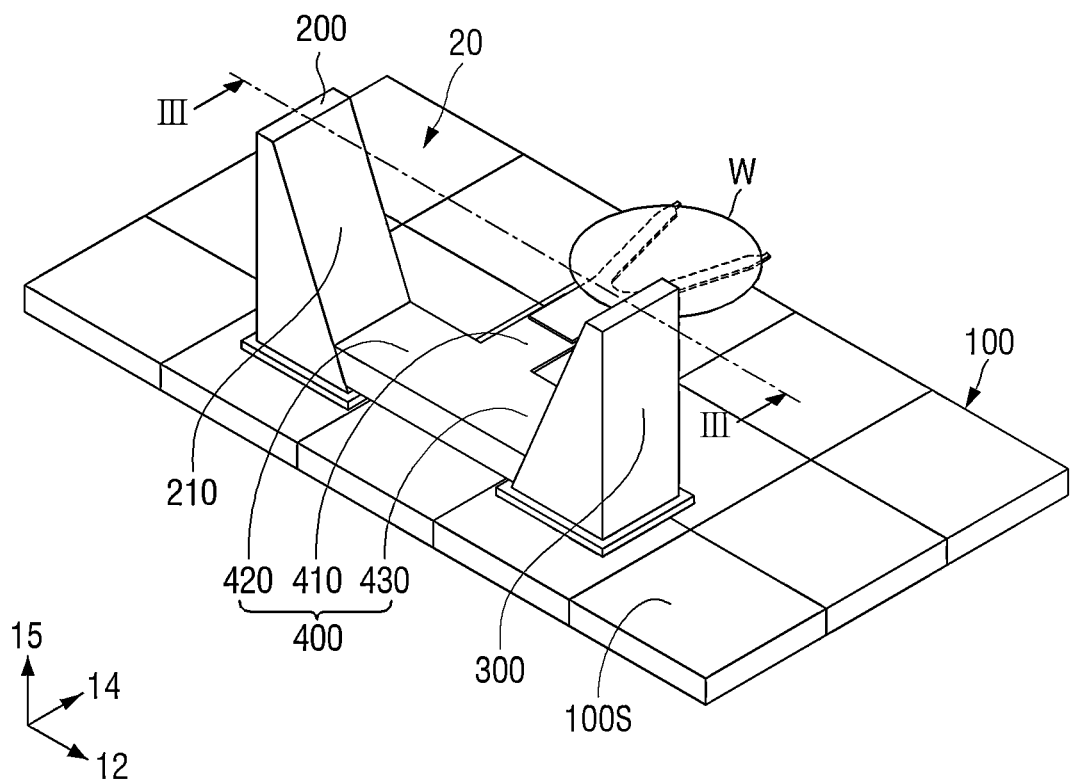
FIG. 1 is a perspective view for describing a substrate transferring apparatus according to an embodiment of the present invention.

Hereinafter, preferred embodiments of the present disclosure will be described in detail with reference to the accompanying drawings. Advantages and features of the present disclosure and methods of achieving them will become apparent with reference to the embodiments described below in detail in conjunction with the accompanying drawings. However, the present disclosure is not limited to the embodiments described below, but may be implemented in various different forms, and these embodiments are provided only for making the description of the present disclosure complete and fully informing those skilled in the art to which the present disclosure pertains on the scope of the present disclosure, and the present disclosure is only defined by the scope of the claims. Like reference numerals refer to like elements throughout.

When an element or layer is referred as being located "on" another element or layer, it includes not only being located directly on the other element or layer, but also with intervening other layers or elements. On the other hand, when an element is referred as being "directly on" or "immediately on," it indicates that no intervening element or layer is interposed.

Spatially relative terms "below," "beneath," "lower," "above," and "upper" can be used to easily describe a correlation between an element or components and other elements or components. The spatially relative terms should be understood as terms including different orientations of the device during use or operation in addition to the orientation shown in the drawings. For example, when an element shown in the figures is turned over, an element described as "below" or "beneath" another element may be placed "above" the other element. Accordingly, the exemplary term "below" may include both directions below and above. The device may also be oriented in other orientations, and thus spatially relative terms may be interpreted according to orientation.

Although first, second, etc. are used to describe various elements, components, and/or sections, it should be understood that these elements, components, and/or sections are not limited by these terms. These terms are only used to distinguish one element, component, or section from another element, component, or section. Accordingly, the first element, the first component, or the first section mentioned below may be the second element, the second component, or the second section within the technical spirit of the present disclosure.

Hereinafter, embodiments of the present disclosure will be described in detail with reference to the accompanying drawings, and in the description with reference to the accompanying drawings, the same or corresponding components are given the same reference numbers or reference numerals in drawings, and an overlapped description therewith will be omitted.

Figure 2:
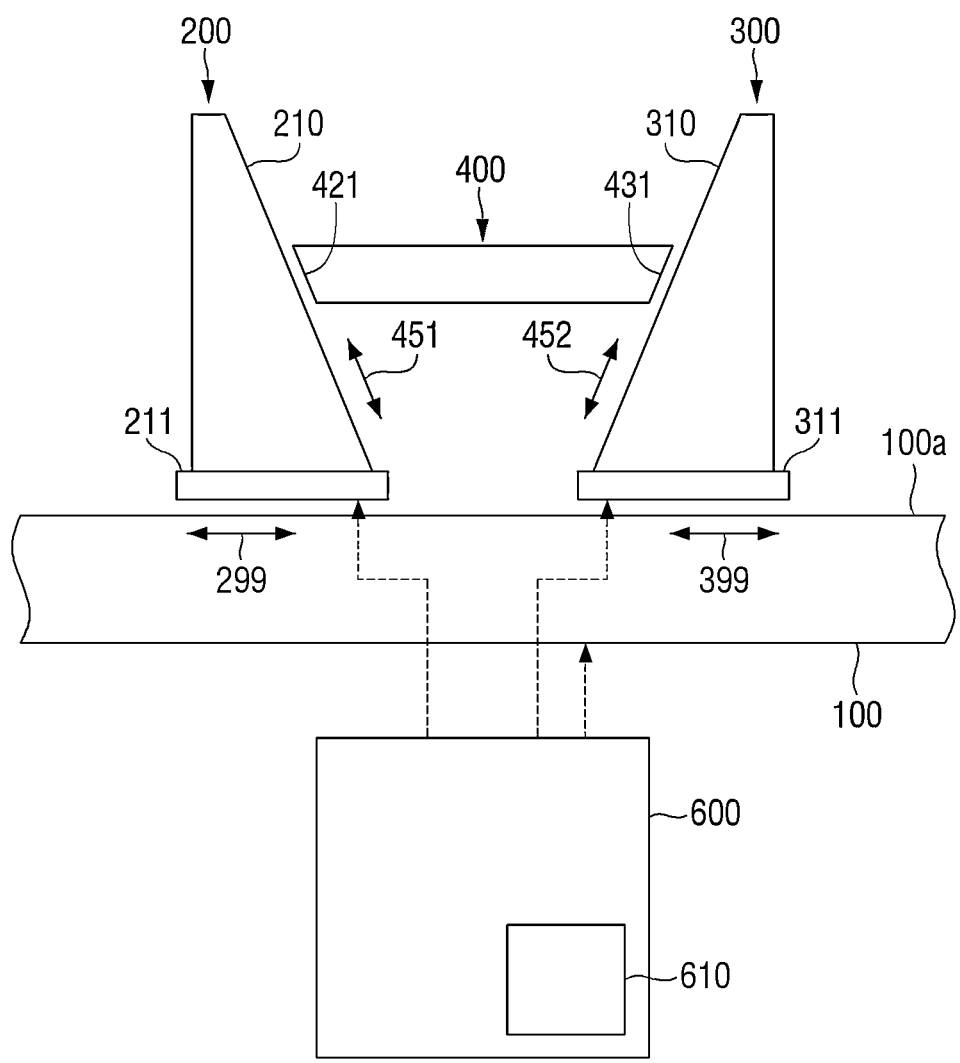
FIG. 2 is a block diagram illustrating the substrate transferring apparatus of FIG. 1.
Figure 3:
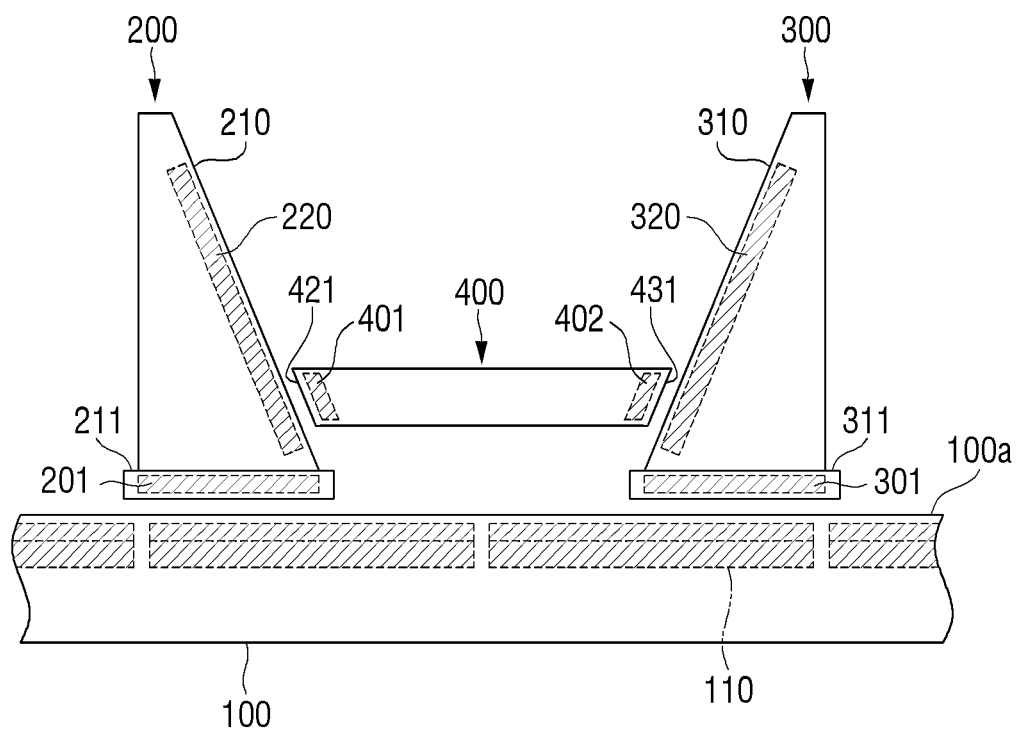
FIG. 3 is a cross-sectional view taken along line III-III of FIG. 1.

FIG. 1 is a perspective view for describing a substrate transferring apparatus according to an embodiment of the present invention. FIG. 2 is a block diagram illustrating the substrate transferring apparatus of FIG. 1. FIG. 3 is a cross-sectional view taken along line III-III of FIG. 1.

Referring to FIGS. 1 to 3, a substrate transferring apparatus according to an embodiment of the present invention includes a stator assembly 100 and a transfer assembly 20.

The stator assembly 100 includes a driving surface 100a, and the driving surface 100a extends in a first direction (e.g., x-direction) 12 and a second direction (e.g., y-direction) 14. For example, the stator assembly 100 may include a plurality of stator sectors 100S arranged in a matrix form. Each stator sector 100S may be in the form of a plate and may include at least one electromagnetic generating unit. An exemplary configuration of such a stator sector 100S will be described later with reference to FIG. 4.

The transfer assembly 20 transfers the substrate W while moving on the driving surface 100a. The transfer assembly 20 includes a first mover 200, a second mover 300, and a transfer member 400. The first mover 200 floats and moves on the driving surface 100a and includes a first inclined surface 210. The first inclined surface 210 forms an acute angle with the first bottom surface 211. The second mover 300 floats and moves on the driving surface 100a and includes a second inclined surface 310. The second inclined surface 310 forms an acute angle with the second bottom surface 311. As illustrated, the first inclined surface 210 and the second inclined surface 310 may be disposed to face each other.

The transfer member 400 is disposed between the first mover 200 and the second mover 300, and may move along the first inclined surface 210 and the second inclined surface 310. The transfer member 400 includes, for example, a body 410, a first support unit 420 protruding from the body 410 toward the first mover 200, and a second support unit 430 protruding from the body 410 toward the second mover 300. The first support unit 420 includes a first support surface 421 facing the first inclined surface 210 of the first mover 200. The second support unit 430 includes a second support surface 431 facing the second inclined surface 310 of the second mover 300.

Meanwhile, the controller 600 controls the operations of the stator assembly 100, the first mover 200, and the second mover 300. The controller 600 may include a memory 610 that stores data and instructions related to operation control of the stator assembly 100, the first mover 200, and the second mover 300. The memory 610 may be located within the controller 600 or may be located outside the controller 600. Under the control of the controller 600, the first mover 200 and the second mover 300 may move along the first direction 12 and the second direction 14 (e.g., on the xy plane), and the distance between the first mover 200 and the second mover 300 may also be adjusted. The memory 610 includes, for example, instructions instructing a plurality of operations shown in FIGS. 6 to 13.

Since the first mover 200 and the second mover 300 are physically separated from each other, the first mover 200 and the second mover 300 may be individually moved by the controller 600 (see 299 and 399 in FIG. 2).

The transfer member 400 may move in a third direction (e.g., z-direction) 15 along the first inclined surface 210 of the first mover 200 and the second inclined surface 310 of the second mover 300 (see 451 and 452 of FIG. 2). Specifically, the height of the transfer member 400 may change according to the distance between the first mover 200 and the second mover 300. For example, when the distance between the first mover 200 and the second mover 300 is the first distance, the height of the transfer member 400 may be the first height. When the distance between the first mover 200 and the second mover 300 becomes a second distance greater than the first distance, the height of the transfer member 400 may be a second height lower than the first height.

Meanwhile, the electromagnetic generating module 110 is installed in the stator assembly 100. A first magnet module 201 facing the electromagnetic generating module 110 is installed in the first mover 200. For example, the first magnet module 201 may be installed on the first bottom surface 211 of the first mover 200. A second magnet module 301 facing the electromagnetic generating module 110 is installed in the second mover 300. For example, the second magnet module 301 may be installed on the second bottom surface 311 of the second mover 300. According to the electromagnetic force of the electromagnetic generating module 110, the first magnet module 201, and the second magnet module 301, the first mover 200 and the second mover 300 may float and move on the driving surface 100a of the stator assembly 100. This will be described in detail later with reference to FIGS. 4 and 5.

Also, as described above, the first inclined surface 210 of the first mover 200 and the first support surface 421 of the transfer member 400 face each other. The first magnet member 220 is installed in the first inclined surface 210, and the second magnet member 401 is installed in the first support surface 421. For example, the first magnet member 220 may be an electromagnet, and the second magnet member 401 may be a permanent magnet. By adjusting the amount of current supplied to the first magnet member 220, the magnetic force of the electromagnet can be adjusted, and accordingly, the distance between the first inclined surface 210 and the first support surface 421 can be adjusted.

Similarly, the second inclined surface 310 of the second mover 300 and the second support surface 431 of the transfer member 400 face each other. The third magnet member 320 is installed in the second inclined surface 310, and the fourth magnet member 402 is installed in the second support surface 431. For example, the third magnet member 320 may be an electromagnet, and the fourth magnet member 402 may be a permanent magnet. By adjusting the amount of current supplied to the third magnet member 320, the magnetic force of the electromagnet can be adjusted, and accordingly, the distance between the second inclined surface 310 and the second support surface 431 can be adjusted.

Depending on the design, both the first magnet member 220 and the second magnet member 401 may be electromagnets, or both may be permanent magnets. Both the third magnet member 320 and the fourth magnet member 402 may be electromagnets, or both may be permanent magnets.

The relative positions can be controlled by the magnetic force generated from the electromagnetic generating module 110 of the stator assembly 100, the first magnet module 201 of the first mover 200, and the second magnet module 301 of the second mover 300. Further, the relative position can be controlled by the magnetic force generated from the first magnet member 220 of the first mover 200, the third magnet member 320 of the second mover 300, the second magnet member 401 of the transfer member 400, and the fourth magnet member 402.

In summary, the stator assembly 100, the first mover 200, the second mover 300, and the transfer member 400 are physically separated from each other. The movement/position control of the stator assembly 100, the first mover 200, the second mover 300, and the transfer member 400 is performed using a non-contact type driving force such as an electromagnet/permanent magnet. Accordingly, it is possible to minimize the generation of particles that may be generated by the movement of the first mover 200, the second mover 300, and the transfer member 400. Process defects that may be caused by particles can be minimized.

Although the first mover 200 and the second mover 300 may be individually moved by the controller 600, the controller 600 may limit the distance between the first mover 200 and the second mover 300 within a preset range such that the transfer member 400 is not separated from the first mover 200 and the second mover 300. Such a control method of the controller will be described later in detail with reference to FIGS. 6 to 12.

Figure 4:
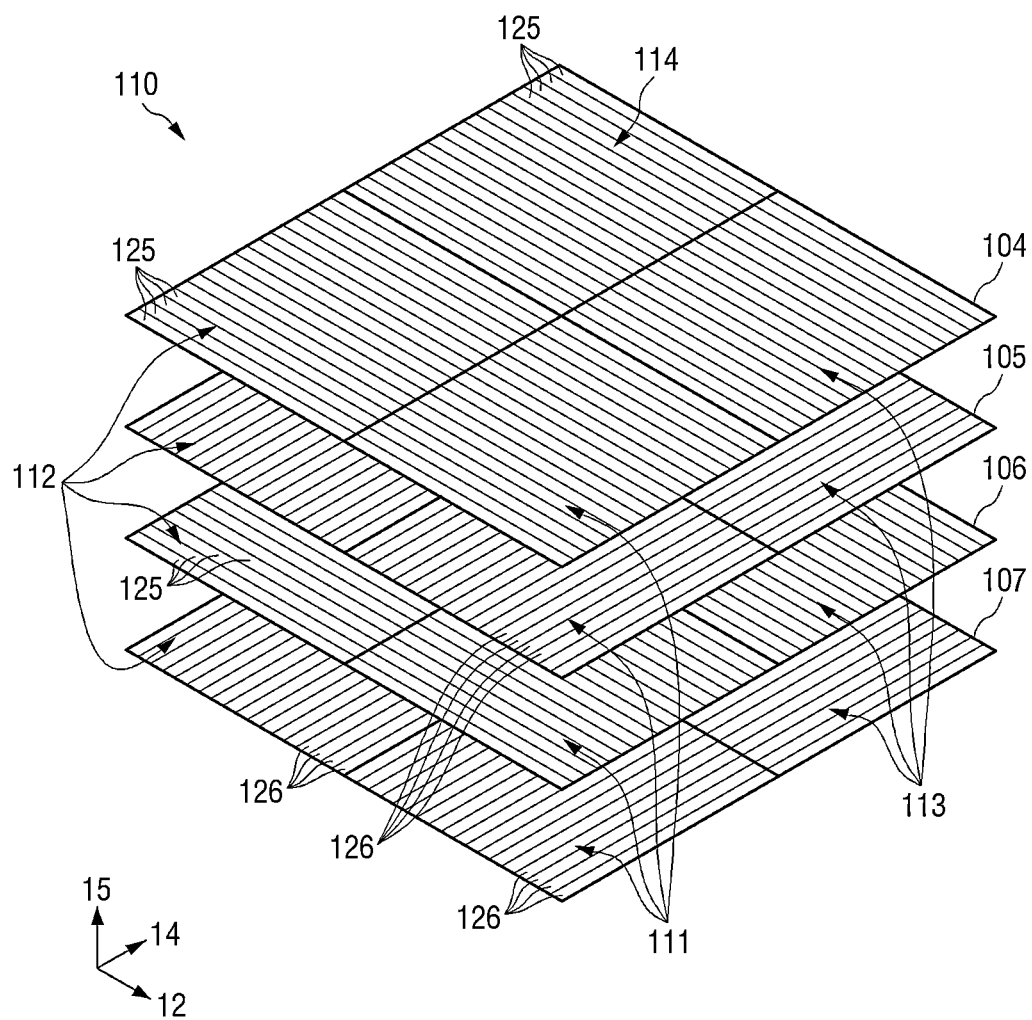
FIG. 4 is a view for describing the stator assembly shown in FIG. 1.
Figure 5:
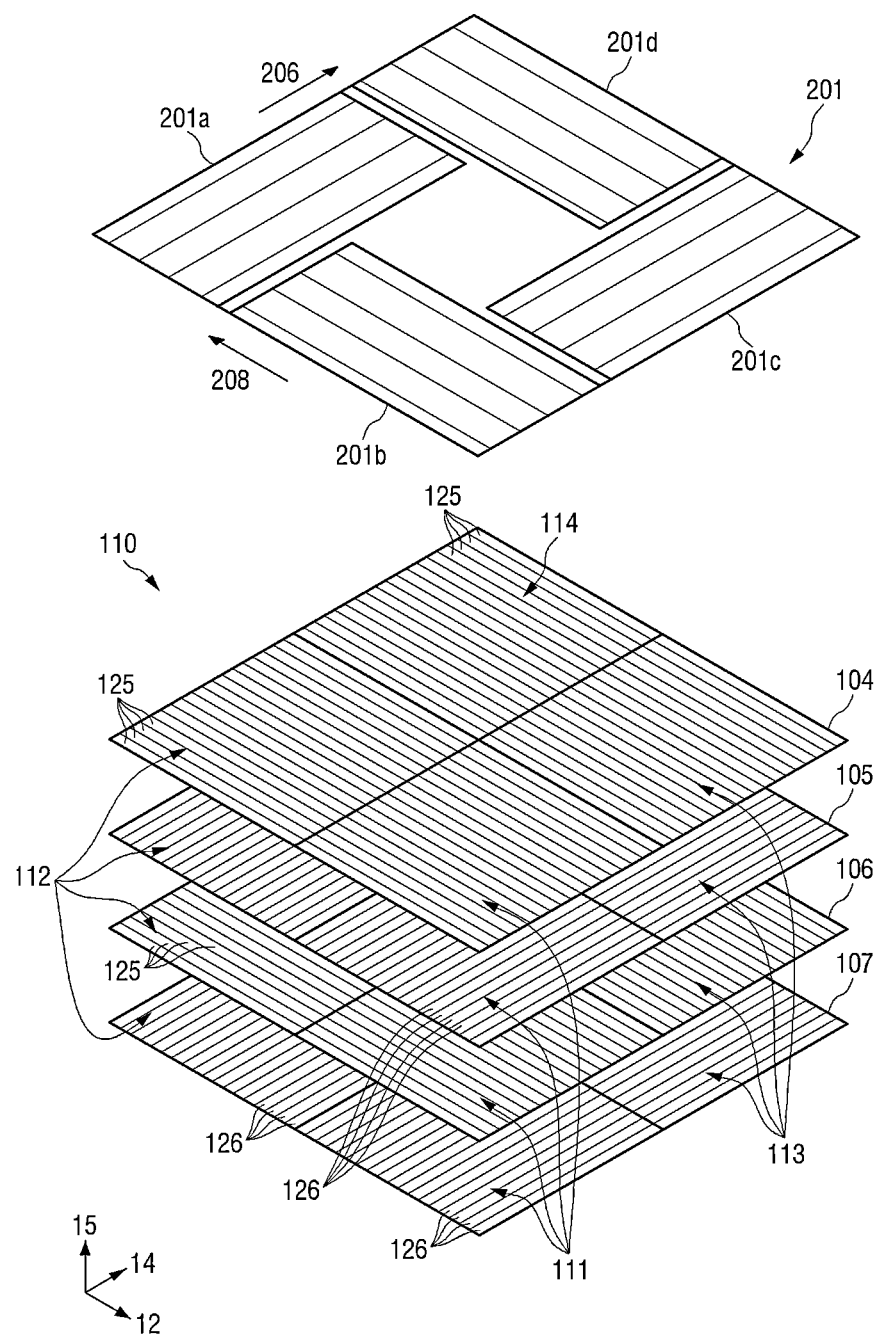
FIG. 5 is a view for describing a relationship between the stator assembly and the first mover shown in FIG. 1.

FIG. 4 is a view for describing the stator assembly shown in FIG. 1. FIG. 5 is a view for describing a relationship between the stator assembly and the first mover shown in FIG. 1. Although the relationship between the stator assembly and the first mover has been described in FIG. 5, the same applies to the relationship between the stator assembly and the second mover.

Referring to FIG. 4, the stator assembly 100 includes a plurality of stator sectors 111, 112, 113 and 114 arranged in a matrix form. In FIG. 4, it is illustratively shown that four stator sectors 111, 112, 113, and 114 are arranged in a 2×2, but the present invention is not limited thereto.

The electromagnetic generating module 110 of each of the stator sectors 111, 112, 113, 114 may include a plurality of stator layers 104, 105, 106, 107. The first stator layer 104, the second stator layer 105, the third stator layer 106, and the fourth stator layer 107 may be sequentially arranged from top to bottom.

The first stator layer 104 and the third stator layer 106 include a plurality of first electromagnetic generating units 125 extending along the first direction 12. For example, the plurality of first electromagnetic generating units 125 have the same dimensions as each other.

The second stator layer 105 and the fourth stator layer 107 include a plurality of second electromagnetic generating units 126 extending along a second direction 14 different from the first direction 12. For example, the plurality of second electromagnetic generating units 126 have the same dimensions as each other.

Also, any stator layer (e.g., 105) of the plurality of stator layers 104, 105, 106, 107 may be electrically insulated from another stator layer (e.g., 104, 106) immediately adjacent thereto. For example, a plurality of stator layers 104, 105, 106, 107 may be implemented as conductor path layers insulated from each other of a multilayer printed circuit board.

The plurality of stator sectors 111, 112, 113, and 114 may be implemented to receive power independently of each other. In particular, within each stator sector 111, 112, 113, 114, the first electromagnetic generating unit 125 and the second electromagnetic generating unit 126 may be implemented to be insulated from each other. On the other hand, within each stator sector 111, 112, 113, 114, the first electromagnetic generating unit 125 of the first stator layer 104 and the first electromagnetic generating unit 125 of the third stator layer 106 may be electromagnetically coupled. Similarly, within each stator sector 111, 112, 113, 114, a second electromagnetic generating unit 126 of the second stator layer 105 and a second electromagnetic generating unit 126 of the fourth stator layer 107 may be electromagnetically coupled.

Referring to FIG. 5, the first magnet module 201 of the first mover 200 includes a plurality of magnets 201a, 201b, 201c, and 201d. The first magnet module 201 includes a plurality of first magnets 201a extending in a first rotor direction 206, a plurality of second magnets 201b extending in a second rotor direction 208, a plurality of third magnets 201c extending in a first rotor direction 206, and a plurality of fourth magnets 201d extending in a second rotor direction 208. The first magnet 201a and the third magnet 201c and the second magnet 201b and the fourth magnet 201d are magnetized in a direction perpendicular to each other.

The first mover 200 may be aligned with the stator assembly 100 such that the first rotor direction 206 is oriented along the second direction 14 and the second rotor direction 208 is oriented along the first direction 12. In operation, the first magnet 201a and the third magnet 201c serve to interact with the magnetic field generated by the second electromagnetic generating unit 126, so that the first mover 200 moves in the first direction 12. Similarly, the second magnet 201b and the fourth magnet 201d serve to interact with the magnetic field generated by the first electromagnetic generating unit 125, so that the first mover 200 moves in the second direction 14.

Figure 6:
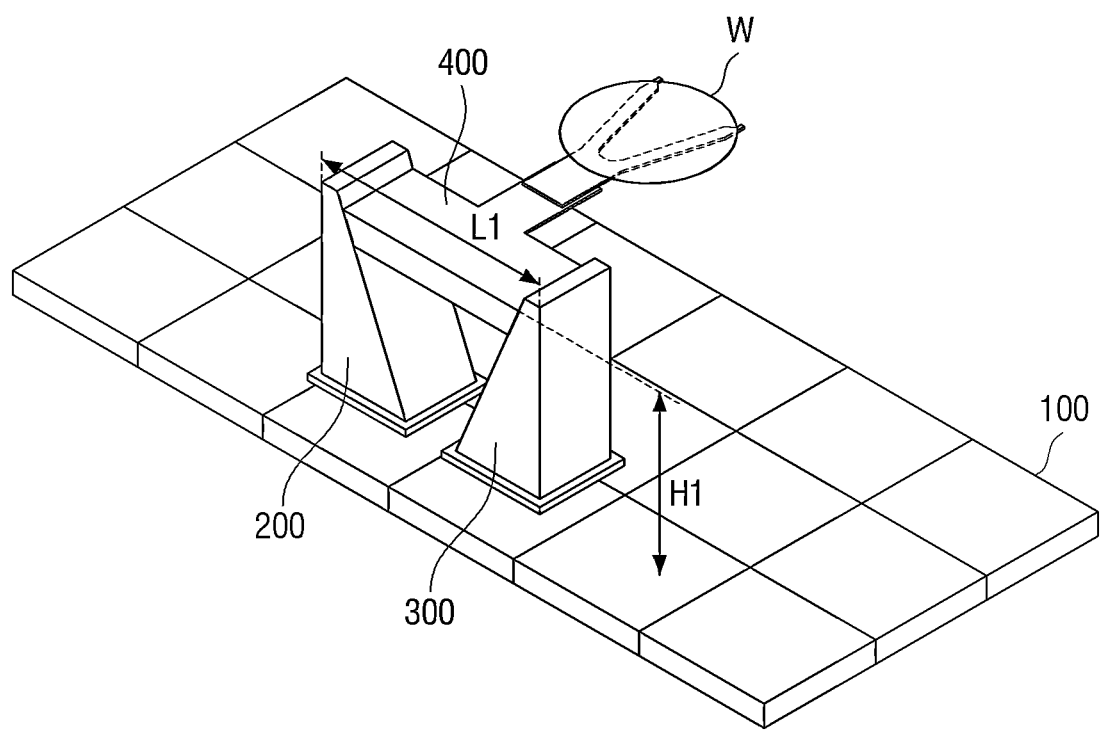
FIGS. 6 and 7 are views for describing a first operation of the substrate transferring apparatus according to an embodiment of the present invention.
Figure 7:
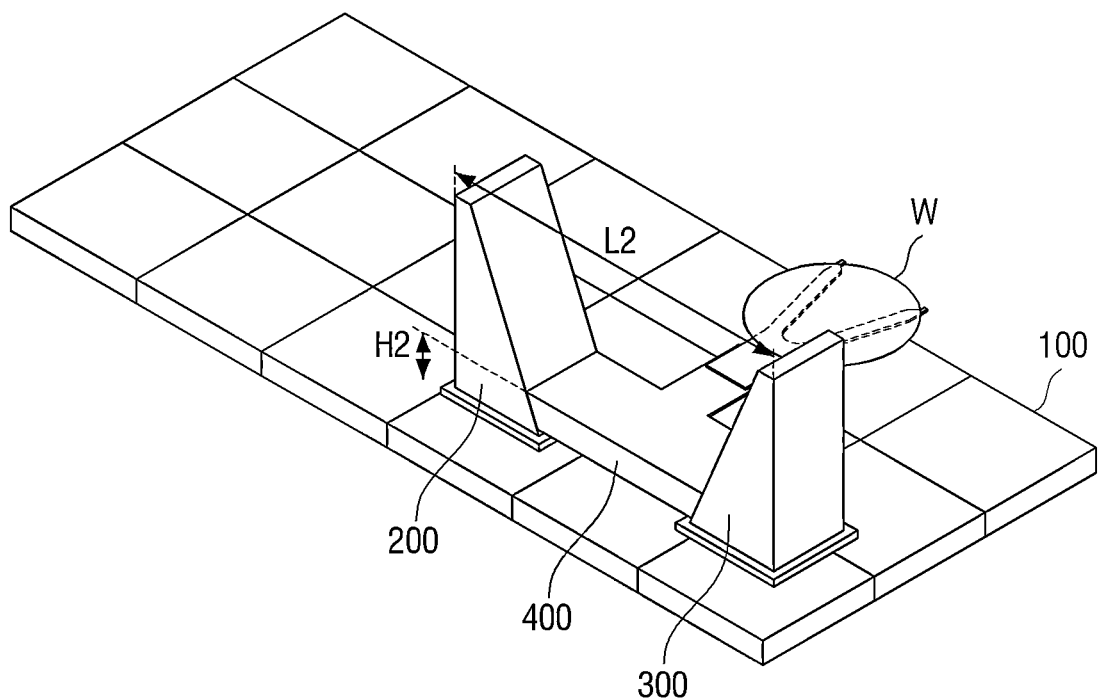

FIGS. 6 and 7 are views for describing a first operation of the substrate transferring apparatus according to an embodiment of the present invention. Here, the first operation is an up-down operation of the transfer member 400.

Referring to FIG. 6, the distance between the first mover 200 and the second mover 300 before movement is the first distance L1. When the distance between the first mover 200 and the second mover 300 is the first distance L1, the height of the transfer member 400 is the first height H1.

Referring to FIG. 7, the distance between the first mover 200 and the second mover 300 after movement is the second distance L2. The second distance L2 is greater than the first distance L1. When the distance between the first mover 200 and the second mover 300 increases, the transfer member 400 descends along the first inclined surface 210 and the second inclined surface 310. Therefore, when the distance between the first mover 200 and the second mover 300 is the second distance L2, the height of the transfer member 400 is a second height H2 lower than the first height H1.

Figure 8:
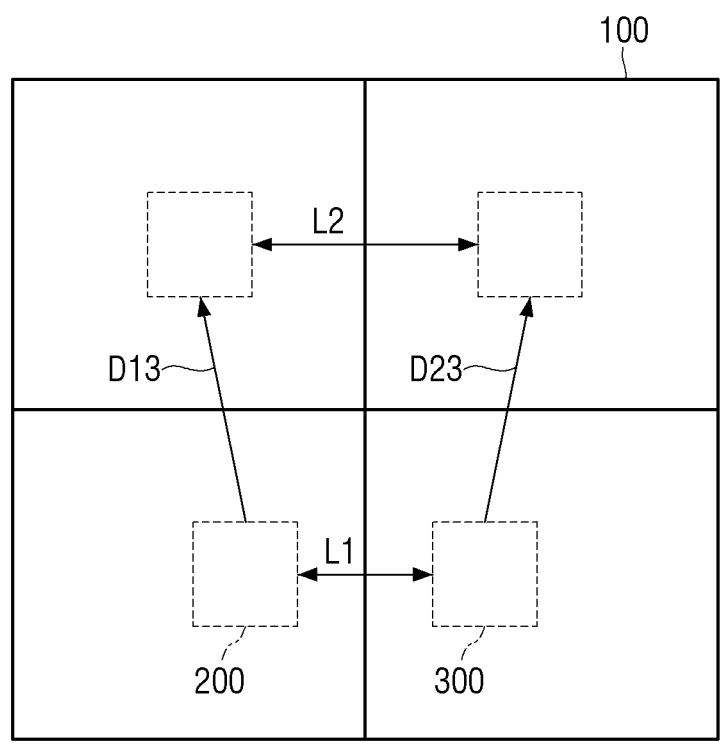
FIG. 8 is a view for describing a second operation of the substrate transferring apparatus according to an embodiment of the present invention.

FIG. 8 is a view for describing a second operation of the substrate transferring apparatus according to an embodiment of the present invention.

Referring to FIG. 8, the distance between the first mover 200 and the second mover 300 before movement is the first distance L1. As the first mover 200 and the second mover 300 move forward, the distance between the first mover 200 and the second mover 300 increases (see reference numerals D13 and D23). As a result, the distance between the first mover 200 and the second mover 300 after movement is the second distance L2.

As the first mover 200 and the second mover 300 move forward, the distance between them increases. And thus, as the first mover 200 and the second mover 300 move forward, the height of the transfer member 400 decreases.

Although not shown separately, when the first mover 200 and the second mover 300 move forward and the distance between them becomes closer, the height of the transfer member 400 may be increased while the first mover 200 and the second mover 300 move forward.

Figure 9:
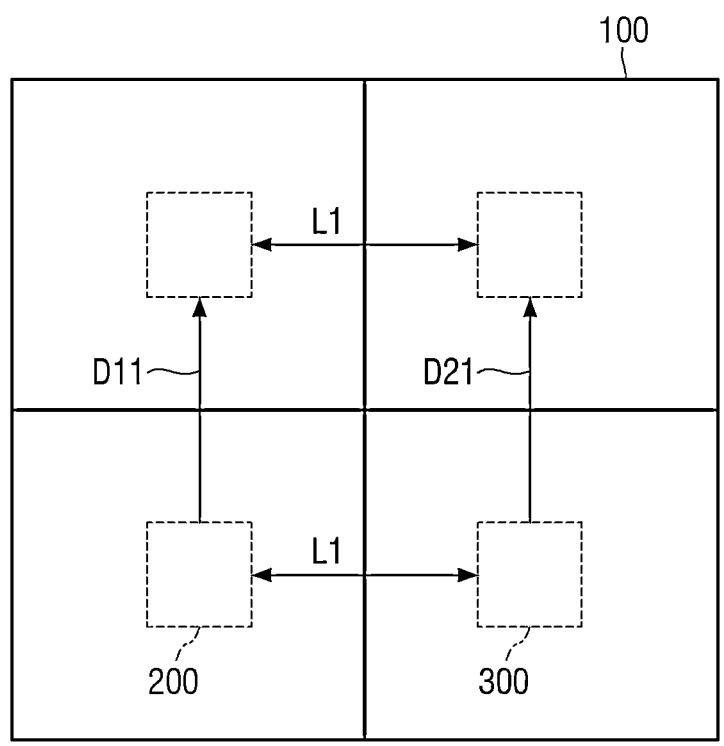
FIG. 9 is a view for describing a third operation of the substrate transferring apparatus according to an embodiment of the present invention.

FIG. 9 is a view for describing a third operation of the substrate transferring apparatus according to an embodiment of the present invention.

Referring to FIG. 9, the distance between the first mover 200 and the second mover 300 before movement is the first distance L1. While the first mover 200 and the second mover 300 move forward, the distance between the first mover 200 and the second mover 300 is maintained (see reference numerals D11 and D21). As a result, the distance between the first mover 200 and the second mover 300 after movement is the first distance L1.

In this case, while the first mover 200 and the second mover 300 move, the height of the transfer member 400 is also maintained constant.

Figure 10:
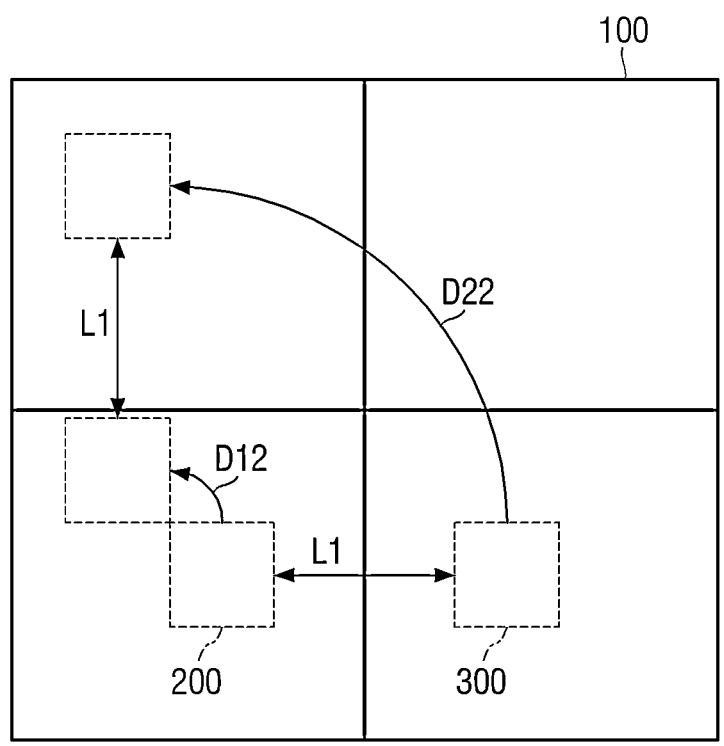
FIG. 10 is a view for explaining a fourth operation of the substrate transferring apparatus according to an embodiment of the present invention.

FIG. 10 is a view for describing a fourth operation of the substrate transferring apparatus according to an embodiment of the present invention.

Referring to FIG. 10, the distance between the first mover 200 and the second mover 300 before movement is the first distance L1. The first mover 200 moves in a counterclockwise direction along a relatively small radius (see reference numeral D12). The second mover 200 moves in a counterclockwise direction along a relatively large radius (see reference numeral D22). The distance between the first mover 200 and the second mover 300 after movement is still the first distance L1.

In this case, while the first mover 200 and the second mover 300 move along the radius, the height of the transfer member 400 is also maintained constant.

Although not shown separately, when the first mover 200 and the second mover 300 move along a radius and the distance between the two becomes closer, the height of the transfer member 400 may be increased while the first mover 200 and the second mover 300 move.

Although not shown separately, when the first mover 200 and the second mover 300 move along a radius and the distance between them increases, while the first mover 200 and the second mover 300 move, the height of 400 of the transfer member may be decreased.

Figure 11:
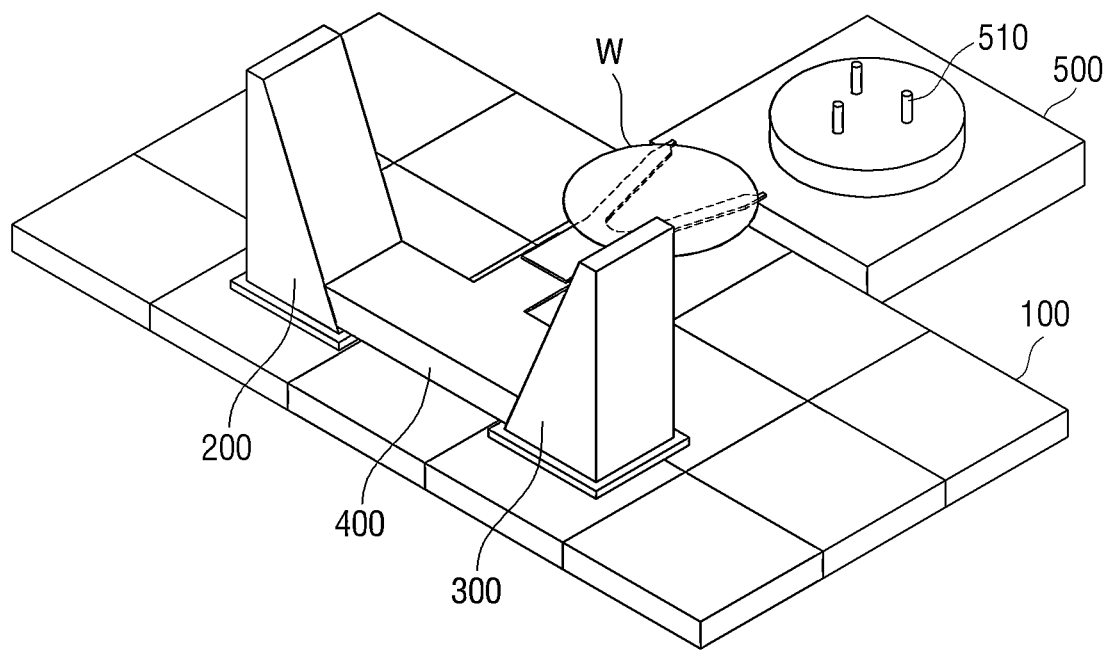
FIGS. 11 and 12 are diagrams for describing a fifth operation of the substrate transferring apparatus according to an embodiment of the present invention.
Figure 12:
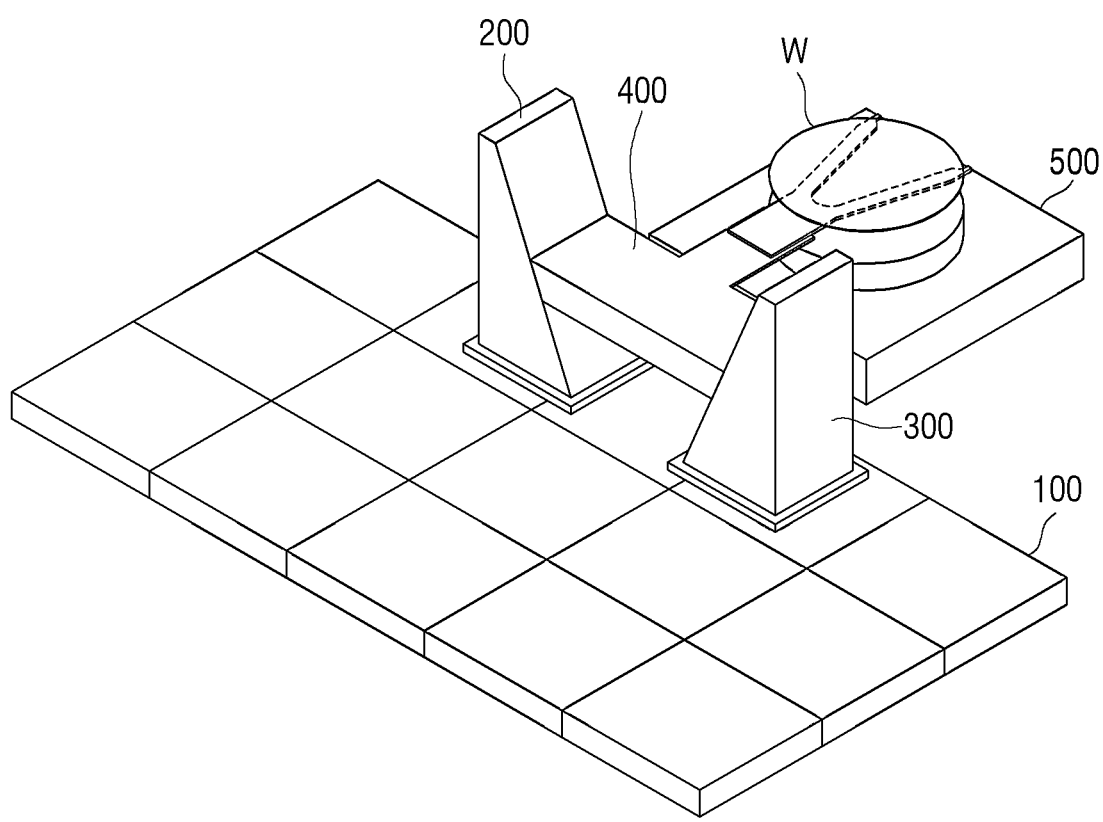

FIGS. 11 and 12 are views for describing a fifth operation of the substrate transferring apparatus according to an embodiment of the present invention. Here, the fifth operation is a pick and place operation of the transfer member 400.

Referring to FIG. 11, in a state where the transfer member 400 supports the substrate, the first mover 200 and the second mover 300 move toward the substrate support member 500.

Referring to FIG. 12, the distance between the first mover 200 and the second mover 300 is narrowed while the first mover 200 and the second mover 300 move forward so that the transfer member 400 or the substrate W does not collide with the substrate support member 500. As a result, when the first mover 200 and the second mover 300 stop in front of the substrate support member 500, the height of the transfer member 400 is slightly increased.

When it is confirmed that the substrate W is located on the substrate support member 500, the height of the transfer member 400 decreases as the distance between the first mover 200 and the second mover 300 increases, and the substrate W is placed on the support pins 510 of the substrate support member 500.

Figure 13:
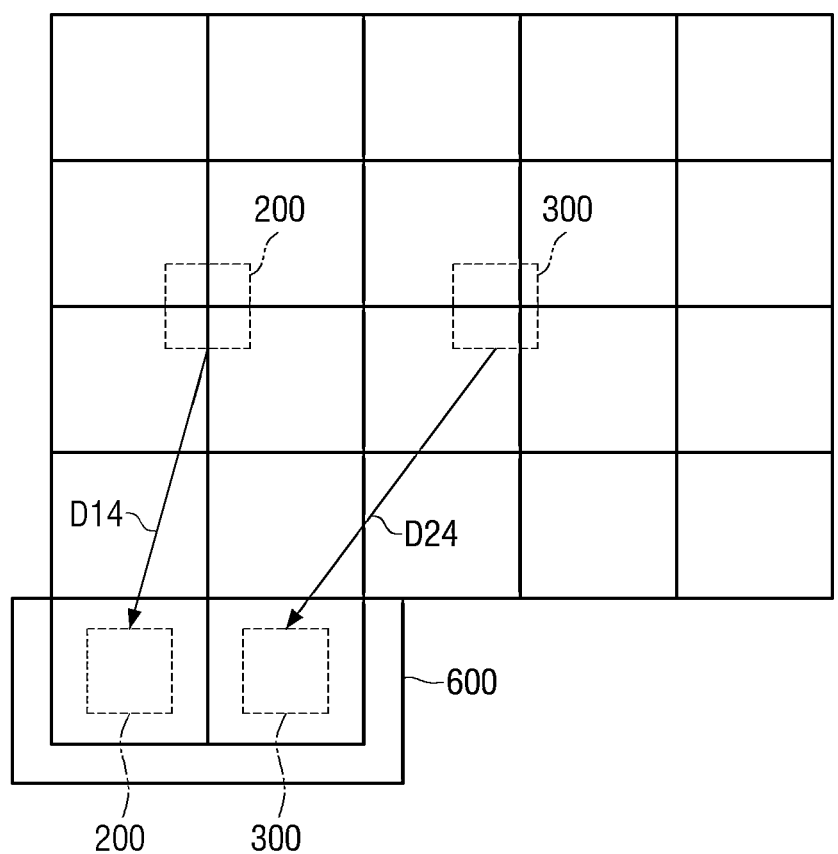
FIG. 13 is a view for describing a substrate transferring apparatus according to another embodiment of the present invention.

FIG. 13 is a view for describing a substrate transferring apparatus according to another embodiment of the present invention.

Referring to FIG. 13, as described above, the first magnet module 201 and the first magnet member 220 are installed in the first mover 200. For example, an electromagnet may be used as the first magnet module 201 or the first magnet member 220, and a first battery (not shown) for supplying power to the electromagnet may be installed in the first mover 200.

Similarly, the second magnet module 301 and the third magnet member 320 are installed in the second mover 300. For example, an electromagnet may be used as the second magnet module 301 or the third magnet member 320, and a second battery (not shown) for supplying power to the electromagnet may be installed in the second mover 300.

A charging port 600 for charging the first/second batteries may be installed at one side of the stator assembly 100. The charging port 600 may be, for example, a wireless charging method, but is not limited thereto.

If the amount of charge is not sufficient or according to a preset recipe, the first and second movers 200 and 300 move into the charging port 600 (see reference numerals D14 and D24) to charge the first and second batteries.

Figure 14:
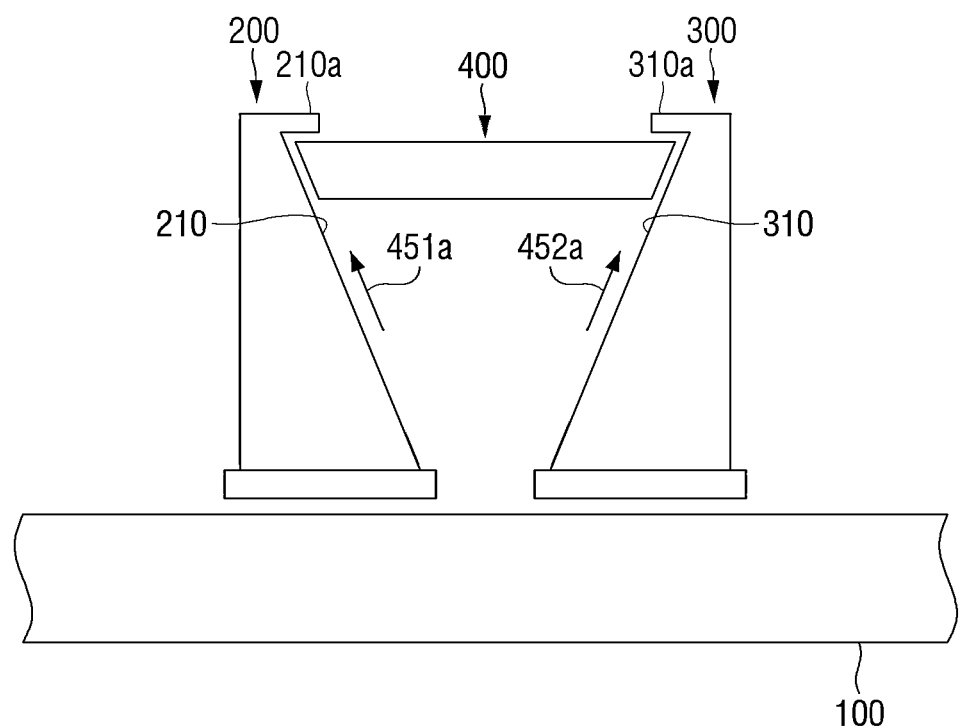
FIG. 14 is a view for describing a substrate transferring apparatus according to another embodiment of the present invention.

FIG. 14 is a view for describing a substrate transferring apparatus according to another embodiment of the present invention.

Referring to FIG. 14, in the substrate transferring apparatus according to another embodiment of the present invention, the transfer member 400 may move upward along a first inclined surface 210 of the first mover 200 and a second inclined surface of the second mover 300 (see 451a and 452a of FIG. 14).

A first stop member 210a protruding from the first inclined surface 210 is installed at the uppermost end of the first inclined surface 210 so that the transfer member 400 does not move above a preset height. A second stop member 310a protruding from the second inclined surface 310 is installed at the uppermost end of the second inclined surface 310.

Although it is illustrated in the drawings that the first stop member 210a and the second stop member 310a are installed on both the first inclined surface 210 and the second inclined surface 310, the present invention is not limited thereto. For example, the first stop member 210a may be installed only on the first inclined surface 210, and the second stop member may not be installed on the second inclined surface 310.

Figure 15:
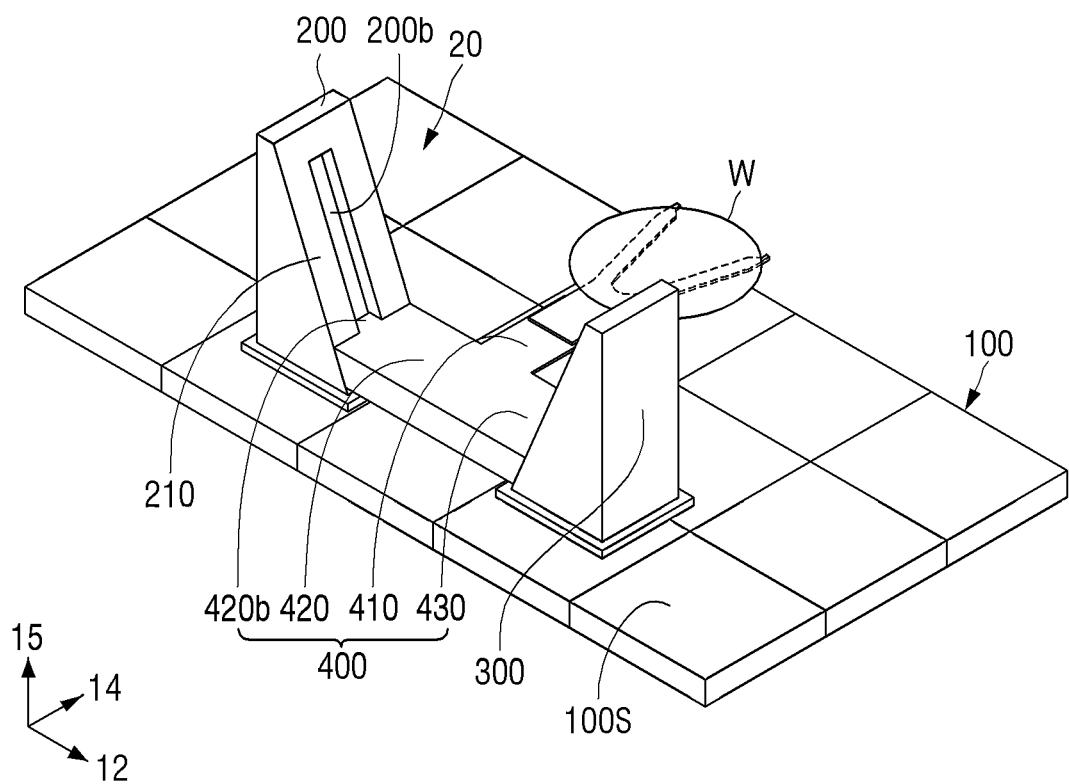
FIG. 15 is a view for describing a substrate transferring apparatus according to another embodiment of the present invention.

FIG. 15 is a view for describing a substrate transferring apparatus according to another embodiment of the present invention. For convenience of description, the points different from those described with reference to FIGS. 1 to 3 will be mainly described.

Referring to FIG. 15, a first guide hole 200b is formed in the first inclined surface 210 along the extending direction of the first inclined surface 210. A first guide bar 420b inserted into the first guide hole 200b may be installed on the first support surface 421 corresponding to the first inclined surface 210 (i.e., in the first support unit 420). Alternatively, the first guide bar may be installed on the first inclined surface 210, and the first guide hole may be installed on the first support surface 421.

Similarly, a second guide hole may be formed in the second inclined surface 310, and a second guide bar inserted into the second guide hole may be installed in the second support surface 431 corresponding to the second inclined surface 310. Alternatively, a second guide bar may be installed on the second inclined surface 310, and a second guide hole may be installed on the second support surface 431.

By providing the guide hole/guide bar as described above, when the transfer member 400 moves along the first inclined surface 210 and the second inclined surface 310, the transfer member 400 may not deviate from the path.

Although embodiments of the present invention have been described with reference to the above and the accompanying drawings, those skilled in the art, to which the present invention pertains, can understand that the present invention may be practiced in other specific forms without changing its technical spirit or essential features. Therefore, it should be understood that the embodiments described above are illustrative in all respects and not limiting.

What is claimed is:

1. An apparatus for transferring a substrate comprising:
a stator assembly including a driving surface and an electromagnetic generating module;
a first mover including a first magnet module facing the electromagnetic generating module and floating and moving on the driving surface, and including a first inclined surface;
a second mover including a second magnet module facing the electromagnetic generating module and floating and moving on the driving surface, and including a second inclined surface; and
a transfer member disposed between the first mover and the second mover and moving along the first inclined surface and the second inclined surface according to a distance between the first mover and the second mover.

2. The apparatus of claim 1, wherein the first inclined surface and the second inclined surface face each other,
wherein the first inclined surface forms an acute angle with a first bottom surface of the first mover,
wherein the second inclined surface forms an acute angle with a second bottom surface of the second mover.

3. The apparatus of claim 2, wherein a distance between the first mover and the second mover is a first distance, and a height of the transfer member is a first height,
wherein a distance between the first mover and the second mover is a second distance greater than the first distance, and a height of the transfer member is a second height lower than the first height.

4. The apparatus of claim 1, wherein the transfer member includes a first support surface facing the first inclined surface, and a second support surface facing the second inclined surface,
wherein the first mover includes a first magnet member installed in the first inclined surface,
wherein the transfer member includes a second magnet member installed in the first support surface.

5. The apparatus of claim 4, wherein the second mover includes a third magnet member installed in the second inclined surface,
wherein the transfer member includes a fourth magnet member installed in the second support surface.

6. The apparatus of claim 5, wherein at least one of the first magnet member and the third magnet member is an electromagnet.

7. The apparatus of claim 4, wherein a battery for supplying power to the first magnet member is installed inside the first mover,
wherein a charging port for charging the battery is installed at one side of the stator assembly.

8. The apparatus of claim 4, wherein a guide hole is installed in any one of the first inclined surface or the first support surface, wherein a guide bar inserted into the guide hole is installed in the other one of the first inclined surface or the first support surface.

9. The apparatus of claim 1, wherein the first mover includes a first stop member installed at an uppermost end of the first inclined surface and protruding from the first inclined surface.

10. The apparatus of claim 1, wherein the stator assembly includes a plurality of stator sectors arranged in a matrix form,
wherein the electromagnetic generating module includes a plurality of electromagnetic generating units,
wherein each stator sector is in the form of a plate and includes at least one electromagnetic generating unit.

11. The apparatus of claim 10, wherein each stator sector includes stacked first stator layer and second stator layer,
wherein the first stator layer includes a plurality of first electromagnetic generating units extending along a first direction,
wherein the second stator layer includes a plurality of second electromagnetic generating units extending along a second direction different from the first direction.

12. The apparatus of claim 1, wherein the first magnet module comprises,
a plurality of first magnets installed on a first bottom surface of the first mover and extending in a first rotor direction, and
a plurality of second magnets installed on a first bottom surface of the first mover and extending in a second rotor direction different from the first rotor direction.

13. An apparatus for transferring a substrate comprising:
a stator assembly including a driving surface and an electromagnetic generating module;
a first mover including a first magnet module facing the electromagnetic generating module and floating and moving on the driving surface, and including a first bottom surface and a first inclined surface forming an acute angle to each other;
a second mover including a second magnet module facing the electromagnetic generating module and floating and moving on the driving surface, and including a second bottom surface and a second inclined surface forming an acute angle to each other, wherein the second inclined surface faces the first inclined surface to each other; and
a transfer member disposed between the first mover and the second mover and moving along the first inclined surface and the second inclined surface according to a distance between the first mover and the second mover,
wherein the transfer member includes a first support surface facing the first inclined surface, and a second support surface facing the second inclined surface,
wherein the first mover includes a first magnet member installed in the first inclined surface, and the transfer member includes a second magnet member installed in the first support surface,
wherein the second mover includes a third magnet member installed in the second inclined surface, and the transfer member includes a fourth magnet member installed in the second support surface.

14. The apparatus of claim 13, wherein a distance between the first mover and the second mover is a first distance, and a height of the transfer member is a first height,
wherein a distance between the first mover and the second mover is a second distance greater than the first distance, and a height of the transfer member is a second height lower than the first height.

15. The apparatus of claim 13, wherein the first magnet member and the third magnet member are electromagnets.

16. The apparatus of claim 13, wherein the stator assembly comprises a plurality of stator sectors arranged in a matrix form,
wherein the electromagnetic generating module includes a plurality of electromagnetic generating units,
wherein each stator sector is in the form of a plate and includes at least one electromagnetic generating unit.

17. The apparatus of claim 16, wherein each stator sector includes stacked first stator layer and second stator layer,
wherein the first stator layer includes a plurality of first electromagnetic generating units extending along a first direction,
wherein the second stator layer includes a plurality of second electromagnetic generating units extending along a second direction different from the first direction.

18. The apparatus of claim 13, wherein the first magnet module comprises,
a plurality of first magnets installed on a first bottom surface of the first mover and extending in a first rotor direction, and
a plurality of second magnets installed on a first bottom surface of the first mover and extending in a second rotor direction different from the first rotor direction.

19. A method for transferring a substrate comprising:
providing a substrate transferring apparatus including a first mover floating and moving on a driving surface and including a first inclined surface, a second mover floating and moving on the driving surface and including a second inclined surface, and a transfer member disposed between the first mover and the second mover, and moving along the first inclined surface and the second inclined surface,
wherein a height of the transfer member is a first height in case of a distance between the first mover and the second mover being a first distance,
wherein the first mover and the second mover move away from each other so that a distance between the first mover and the second mover becomes a second distance, and as the first mover and the second mover move, the transfer member are lowered along the first inclined surface and the second inclined surface so that a height of the transfer member becomes a second height.

20. The method of claim 19, wherein the first inclined surface and the second inclined surface face each other,
wherein the first inclined surface forms an acute angle with a first bottom surface of the first mover,
wherein the second inclined surface forms an acute angle with a second bottom surface of the second mover.

* * * * *